United States Patent [19]

Matsui

[11] Patent Number: 5,766,671

[45] Date of Patent: Jun. 16, 1998

[54] METHOD OF AN APPARATUS FOR FORMING FILM ON SUBSTRATE BY SENSING ATMOSPHERIC PRESSURE

[75] Inventor: Hiroshi Matsui, Kyoto, Japan

[73] Assignee: Dainippon Screen Mfg. Co., Ltd., Japan

[21] Appl. No.: 633,484

[22] Filed: Apr. 17, 1996

[30] Foreign Application Priority Data

Apr. 21, 1995 [JP] Japan .................. 7-120717

[51] Int. Cl.$^6$ .............. B05D 3/12; B05C 11/02
[52] U.S. Cl. .............. 427/8; 427/9; 427/10; 427/240; 118/663; 118/712; 118/52
[58] Field of Search ............. 118/688, 52, 663, 118/712; 427/9, 10, 240, 8

[56] References Cited

FOREIGN PATENT DOCUMENTS

| | | | |
|---|---|---|---|
| 3-178123 | 8/1991 | Japan | 118/52 |
| 4-94525 | 3/1992 | Japan | 118/52 |
| 5-144721 | 6/1993 | Japan . | |

*Primary Examiner*—Katherine A. Bareford
*Attorney, Agent, or Firm*—Ostrolenk, Faber, Gerb & Soffen, LLP

[57] ABSTRACT

A cup with a top opening is disposed in an open-air space, and an atmospheric pressure sensor is disposed externally to the cup. A CPU calculates a control value which compensates for a variation in the thickness of a coating film which is formed on a surface of a substrate, based on an atmospheric pressure value which is measured by the atmospheric pressure sensor. An air-conditioner is controlled in accordance with the control value, whereby the temperature and the humidity of clean air which is supplied around the cup are adjusted and the variation in the thickness of the coating film is prevented without laborious work.

45 Claims, 7 Drawing Sheets

5,766,671

1

METHOD OF AN APPARATUS FOR FORMING FILM ON SUBSTRATE BY SENSING ATMOSPHERIC PRESSURE

BACKGROUND OF THE INVENTION

1. Field of the Invention

The present invention is related to a method of and an apparatus for supplying a coating liquid on a surface of a substrate being rotated, thereby to coat the substrate with the coating liquid to form a thin film.

The coating liquid may be applied to the substrate in order to form a photoresist film, a polyimide resin, a silica-contained coating film, a dopant material or the like. The substrate may be a semiconductor wafer, a glass substrate for a liquid crystal display device or a glass substrate for a photomask.

2. Description of the Background Art

In a surface process of a substrate such as a semiconductor wafer, a glass substrate, a mask substrate or the like, a coating liquid such as a photoresist liquid is applied onto a major surface of the substrate being rotated in a horizontal plane and about a vertical axis to thereby form an extremely thin coating film on the surface of the substrate. In order to ensure the uniformity of the thickness of the coating film, the reproducibility and the controllability, the temperature and the humidity in an atmosphere in which a coating apparatus is installed are locally adjusted and controlled so as to keep the temperature and the humidity constant.

However, the air pressure within a clean room in which the coating apparatus is installed changes subtly between the seasons, or due to arrival of a low or high pressure system, or due to the condition of air-conditioning facilities. Further, even if the temperature and the humidity in the atmosphere are maintained at constant levels, the thickness of the coating film formed on the surface of the substrate changes as the atmospheric pressure within the clean room changes. For instance, since there is a difference in the atmospheric pressure of about 30–100 hPa (mbar) between a fine day and a rainy day, a change of about 10 hPa in the atmospheric pressure changes the thickness of the coating film by about 30 angstroms.

To deal with this, an operator coats a surface of a substrate with a coating liquid as a test, using a coating apparatus, before actually coating the substrate. The operator then adjusts the rotation speed of a motor which rotates the substrate, while measuring the thickness of the coating film which is formed on the surface of the substrate, on a daily basis, to thereby obtain the coating film having a predetermined thickness. However, such adjustment takes about 30 minutes to 1 hour, and daily adjustment of the operation is required. This is a great burden on the operator, and is not desirable either in terms of the efficiency of the operations.

A conventional coating apparatus is constructed to solve these problems, in which a coating part for coating a substrate with a chemical liquid is entirely covered by a temperature/humidity-adjustable air-tight chamber and air is discharged from the chamber through a temperature/humidity-adjustable air outlet. An atmospheric pressure detector for measuring the atmospheric pressure within the chamber is disposed, and a discharging resistance within the temperature/humidity-adjustable air outlet is controlled in accordance with an output from the atmospheric pressure detector to thereby keep the atmospheric pressure within the coating part constant and to eliminate a variation in a film thickness due to a change in the atmospheric pressure.

2

However, since the conventional coating apparatus requires to entirely cover the coating part with the air-tight chamber, it is necessary to open and close the air-tight chamber every time a substrate is loaded into and unloaded from the coating part, which demands to dispose an opening/closing mechanism for this purpose. This increases the size of the apparatus. Further, since the atmospheric pressure within the air-tight chamber and hence the atmospheric pressure within the coating part return to that of outside the air-tight chamber every time a substrate is loaded and unloaded, the atmospheric pressure within the air-tight chamber must be adjusted every time each substrate is processed. For this constraint, coating can not be started until the atmospheric pressure within the air-tight chamber returns to the initial constant value. This is not desirable in terms of the efficiency of the operations.

SUMMARY OF THE INVENTION

The present invention is directed to an apparatus for applying a liquid onto a substrate to form a film on the substrate.

According to the present invention, the apparatus comprises: a) rotation means for rotating the substrate in a horizontal plane; b) cup means surrounding the substrate and having a top opening above the substrate; c) supply means for supplying the liquid onto the substrate; d) control means for controlling conditions of forming the film on the substrate; e) sensor means provided outside of the cup means for sensing atmospheric pressure; determination means for determining a control value for at least one of the conditions which is required to compensate thickness change of the film due to change in the atmospheric pressure; and g) signal generator means for generating a control signal representing the control value and supplying the control signal to the control means, whereby the thickness change of the film due to the change in the atmospheric pressure is compensated.

Since thickness change of the film due to change of the atmospheric pressure is eliminated by controlling the conditions for determining the thickness of the film, it is not necessary for an operator to adjust the rotation speed of a motor for rotating the substrate every day. The operation efficiency is improved. Further, no complex mechanisms are required and the apparatus is compact in size.

According to the present invention, the cup means has the top opening, and therefore, the atmospheric pressure inside the cup means is substantially identical to the outside of the cup means. This allows the sensor means to be provided outside the cup means to thereby attain accurate monitoring of the atmospheric pressure inside the cup means. The sensor means provided outside the cup means is hardly exposed to the liquid splashed from the substrate and correct sensing is attained.

Accordingly, an object of the present invention is to provide an apparatus of a rotary-type which is not very large but has a desirable operation efficiency.

Another object of the present invention is to avoid adjustment of the rotation speed of a motor for rotating a substrate which is conventionally performed by an operator prior to actual coating of the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
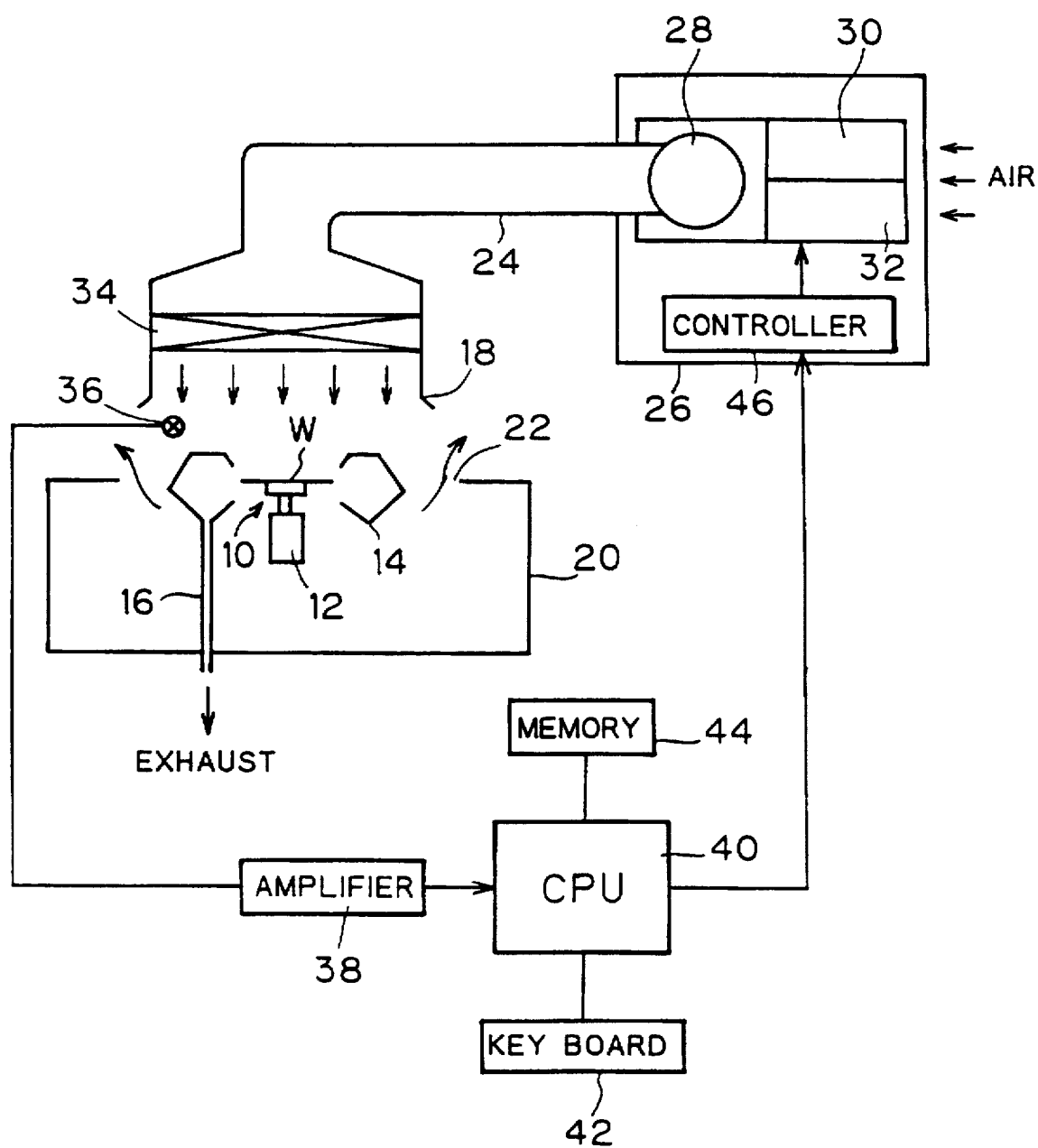
FIG. 1 is a schematic view showing the structure of a rotary-type coating apparatus according to a preferred embodiment of the present invention.

FIG. 1 is a schematic view showing the structure of a rotary-type substrate coating apparatus according to a preferred embodiment of the present invention. The coating apparatus comprises a substrate holding member 10 for rotating a substrate W about a vertical axis while holding the substrate W horizontally. A motor 12 is provided for rotating the substrate W on the substrate holding member 10. The motor 12 is controlled by a control apparatus (not shown). A coating liquid supplying apparatus (not shown) supplies a coating liquid, such as a photoresist liquid, onto a top major surface of the substrate W which is held by the substrate holding member 10. A cup 14 is open at the top and surrounds the substrate W from sides and below so as to collect the coating liquid which is radially splashed from the substrate W. A pipe 16 is linked to a bottom part of the cup 14 to discharge a liquid and air.

A hood 18 is disposed above the cup 14, and a cover 20 is disposed below the hood 18 to surround the cup 14. A ventilation outlet 22 linked to the atmosphere is disposed between the lower end of the hood 18 and the top end of the cover 20, which defines an open-air space around the cup 14. A duct 24 is connected to the hood 18. The duct 24 is connected to a fan 28 of an air-conditioner 26. The air-conditioner 26 incorporates a freezer 30 and a humidifier 32. The temperature and the humidity of air which is taken into the air-conditioner 26 are adjusted by the freezer 30 and the humidifier 32. Air with an adjusted temperature and an adjusted humidity is sent from the air-conditioner 26 through the duct 24, so that it passes through a filter 34 so that clean air is supplied to the hood 18. Clean air with an adjusted temperature and an adjusted humidity flows downward from the hood 18.

Figure 2:
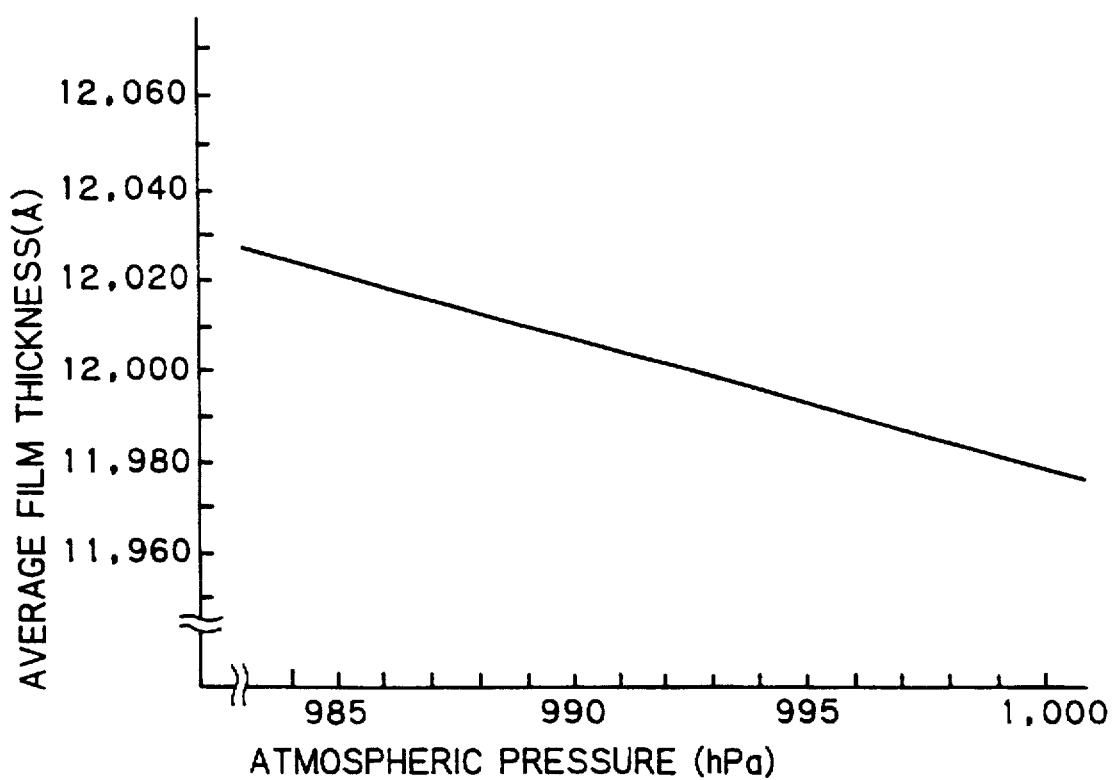
FIG. 2 is a graph showing an example of data which expresses a relationship between the atmospheric pressure and a film thickness.
Figure 3:
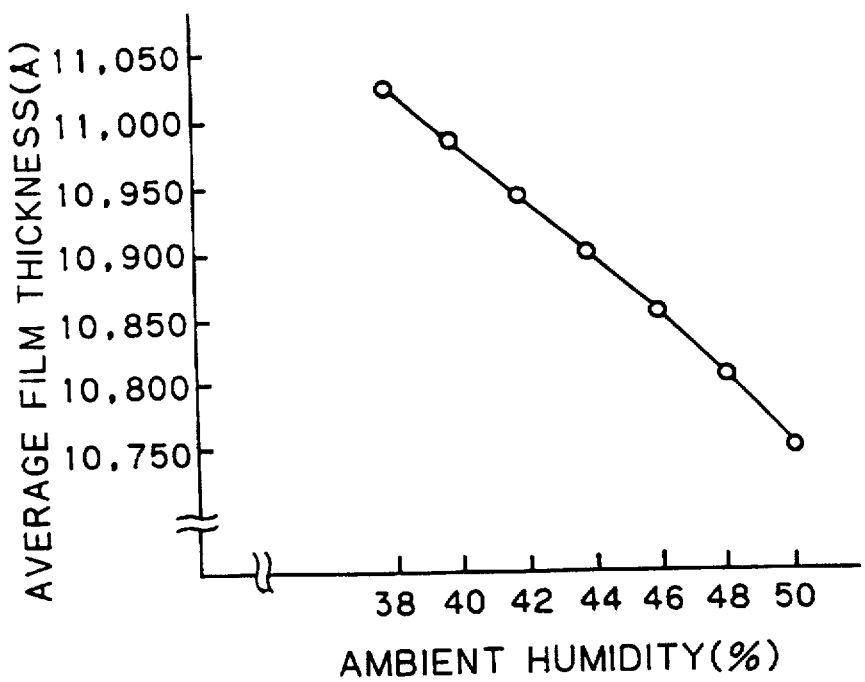
FIG. 3 is a graph showing an example of data which expresses a relationship between ambient humidity and film thickness.
Figure 4:
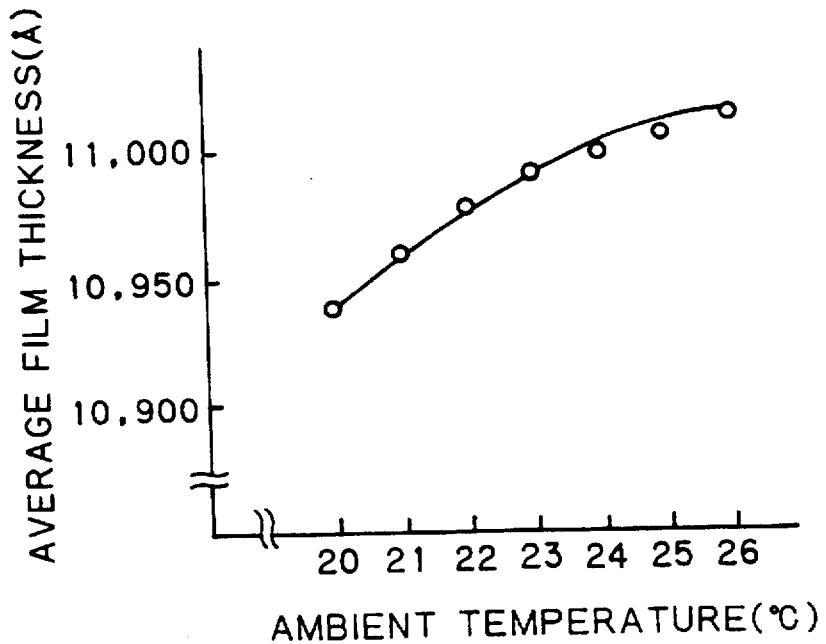
FIG. 4 is a graph showing an example of data which expresses a relationship between ambient temperature and film thickness.

Externally to the cup 14, an atmospheric pressure sensor 36 is disposed which measures the atmospheric pressure (static pressure) of the open-air space surrounding the cup 14. A signal from the atmospheric pressure sensor 36 is supplied to a CPU 40 through an amplifier 38. A key board 42 is connected to the CPU 40. On the key board 42, a value representing a reference air pressure within the hood 18 which is determined in advance is entered in the CPU 40, as a reference air pressure value. The reference air pressure value is stored in a memory associated with the CPU 40. Further, a memory 44 is connected to the CPU 40. The memory 44 stores:

data which expresses a relationship between the atmospheric pressure and the thickness of a coating film as shown in FIG. 2;

data which expresses a relationship between an ambient humidity inside the cup 14, in which the substrate W is mounted, and the film thickness as shown in FIG. 3; and data which expresses a relationship between an ambient temperature inside the cup 14 and the film thickness as shown in FIG. 4.

The data shown in FIGS. 2 to 4 (and similarly, data shown in FIGS. 6 to 9 which will be described later) vary depending on the type of coating liquid, the type of resist solvent, etc., and therefore, the data are compiled in advance through tests on each case. The CPU 40 is connected to a controller 46 of the air-conditioner 26. Since the memory 44 stores data as that shown in FIG. 2 which expresses the relationship between the atmospheric pressure and the film thickness, a desired film thickness value may be designated instead of the reference atmospheric pressure value and entered to the CPU 40, on the key board 42.

In the rotary coating apparatus having such a structure described above, clean air which is adjusted to a predetermined temperature and a predetermined humidity is supplied to the hood 18 from the air-conditioner 26, through the duct 24 and the filter 34. The clean air supplied to the hood 18 flows downward from the above within the hood 18. The clean air partially flows into the cup 14 and is then discharged by exhausting means (not shown) from the cup 14 through the pipe 16. A portion of the air flows from a lower portion of the hood 18 into the cover 20 and is then discharged from the cover 20 into the atmosphere through the ventilation outlet 22. The atmospheric pressure (static pressure) of the open-air space outside the cup 14 is measured by the atmospheric pressure sensor 36, and a detection signal from the atmospheric pressure sensor 36 is supplied to the CPU 40 through the amplifier 38.

The CPU 40 calculates a change of the film thickness due to the difference between the actual atmospheric pressure value which is measured by the atmospheric pressure sensor 36 and the reference atmospheric pressure value which is set in advance, utilizing the data shown in FIG. 2. Alternatively, when a target film thickness value is entered in the CPU 40 through the key board 42, the CPU 40 calculates a film thickness which corresponds to the actual atmospheric pressure value which is measured by the atmospheric pressure sensor, utilizing the data shown in FIG. 2, and then calculates a difference between this film thickness and the target film thickness. Utilizing the data shown in FIG. 3 and/or FIG. 4, the CPU 40 calculates how much the calculated change in the film thickness corresponds to a change in the ambient humidity and/or the ambient temperature, to thereby find how much the ambient humidity and/or the ambient temperature should be changed under control so as to eliminate or compensate a variation in the film thickness due to a change in the atmospheric pressure. For example, the film thickness increases (or decreases) by 30 angstroms as the atmospheric pressure decreases (or increases) by 10 hPa. To eliminate such a change in the film thickness, 1) the ambient humidity may be increased (or decreased) by 1.4%,
2) the ambient temperature may be decreased (or increased) by 2° C., or
3) the ambient humidity may be increased (or decreased) by 0.7% while decreasing (or increasing) the ambient temperature by 1° C.

In accordance with a control value calculated as described above, the CPU 40 supplies a signal to a controller 46 of the air-conditioner 26 and the controller 46 outputs a control signal to the freezer 30 and the humidifier 32. Driving operations of the freezer 30 and the humidifier 32 are controlled so that the temperature and the humidity of the clean air sent from the air-conditioner 26 to the hood 18 are adjusted. Hence, even when the atmospheric pressure within a clean room and therefore the atmospheric pressure around the substrate W which is to be coated change between days or between the morning and the afternoon because of seasons or weather, since the humidity and/or the temperature of the clean air supplied around the substrate W are adjusted so as to compensate the change in the atmospheric pressure, the thickness of a coating film which is formed on a surface of the substrate W does not change.

Figure 5:
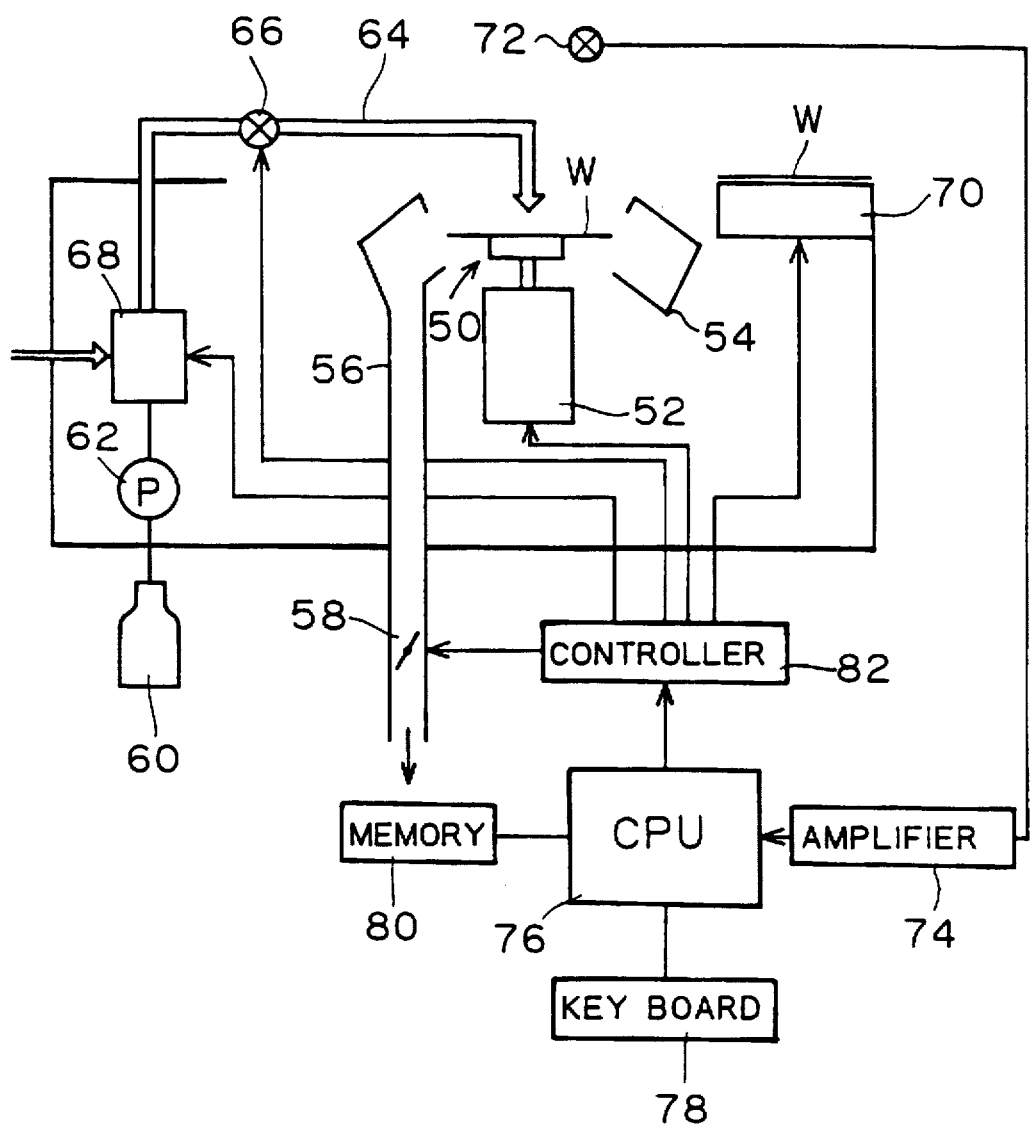
FIG. 5 is a schematic view showing the structure of a rotary-type coating apparatus according to another preferred embodiment of the present invention.

FIG. 5 is a schematic view showing the structure of a rotary-type substrate coating apparatus according to another preferred embodiment of the present invention. The apparatus comprises a substrate holding member 50, a substrate rotating motor 52, a cup 54 which surrounds the substrate W held by the substrate holding member 50 from sides and below and which has a top opening. An exhaust damper 58 is disposed in a pipe 56 which is linked to a bottom portion of the cup 54 for discharging a liquid and air. The exhausting pressure within the cup 54 is adjusted by opening/closing the exhaust damper 58. Also provided is a coating liquid supplying apparatus which comprises a container 60 for storing a coating liquid, such as a photoresist liquid and a liquid supplying pump 62. The coating liquid is supplied through a supplying tube 64 onto a surface of the substrate W which is mounted on the substrate holding member 50. An open/close control valve 66 is inserted in the supplying tube 64 of the coating liquid supplying apparatus. A heat exchanger 68 is also disposed which adjusts the temperature of the coating liquid which is to be applied on the surface of the substrate W through the supplying tube 64. Further, a cooling plate 70 is disposed to adjust the temperature of the substrate W before holding the substrate W with the substrate holding member 50.

Figure 6:
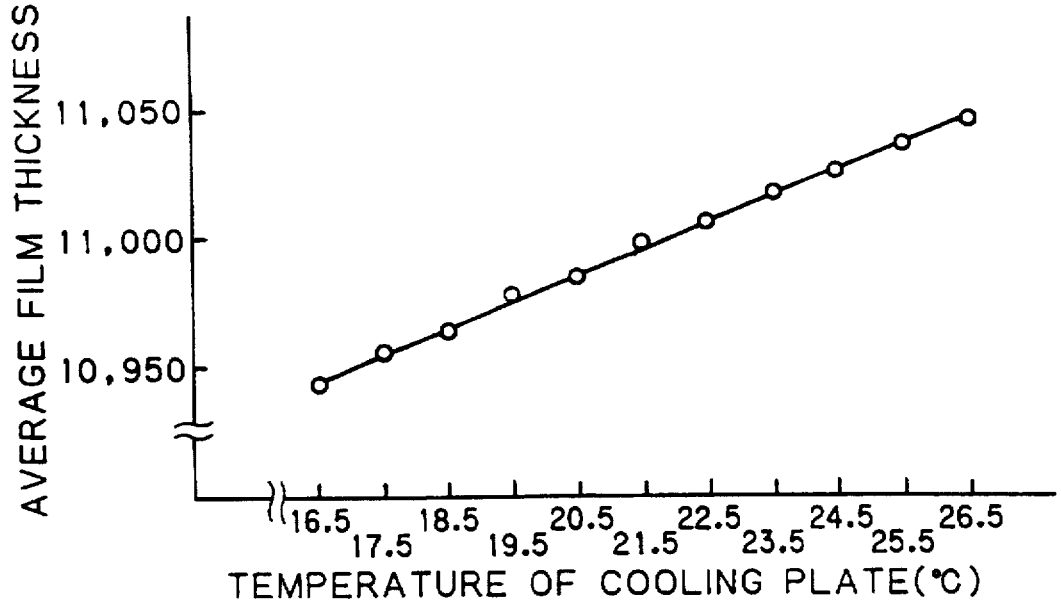
FIG. 6 is a graph showing an example of data which expresses a relationship between the temperature of a cooling plate and film thickness.
Figure 7:
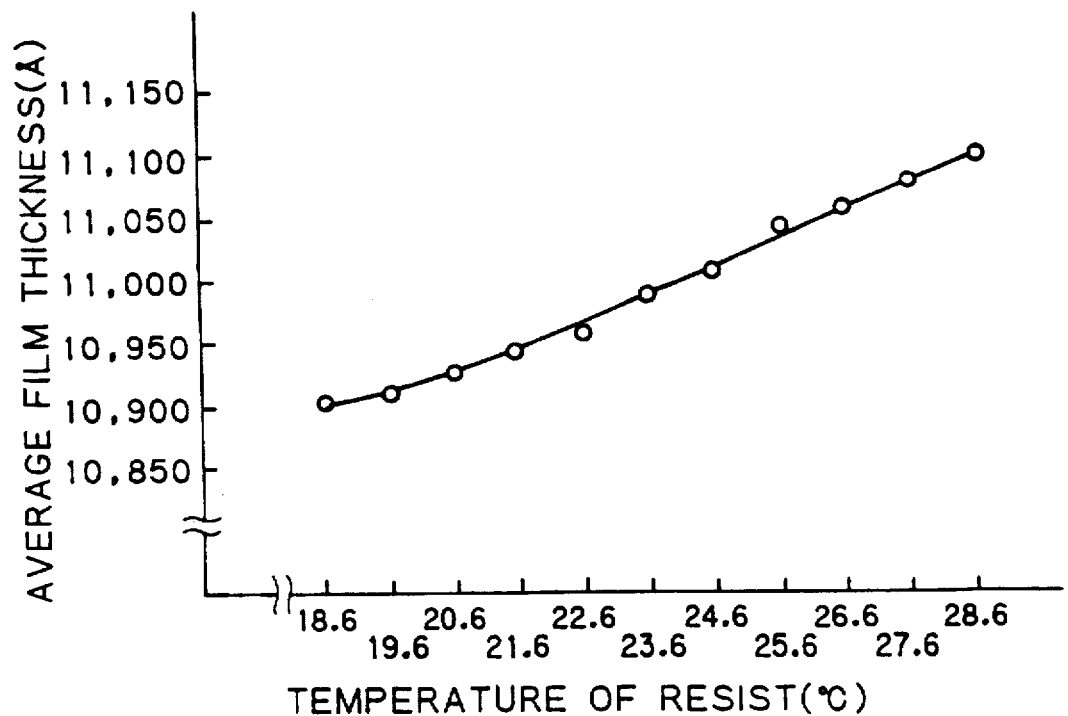
FIG. 7 is a graph showing an example of data which expresses a relationship between the temperature of a photoresist liquid, which is supplied from a coating liquid supplying apparatus to a surface of a substrate, and film thickness.
Figure 8:
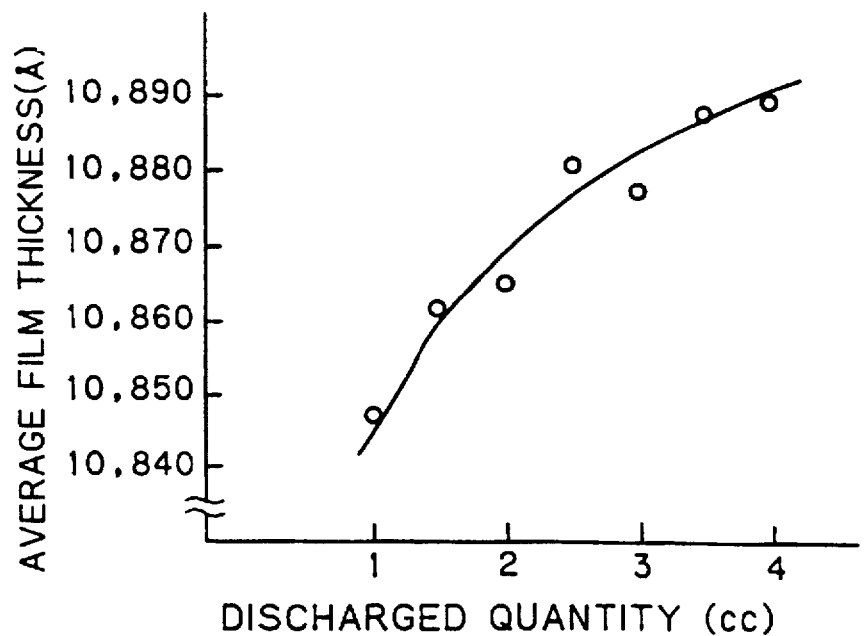
FIG. 8 is a graph showing an example of data which expresses a relationship between the quantity of a photoresist liquid applied onto a surface of each substrate and film thickness.
Figure 9:
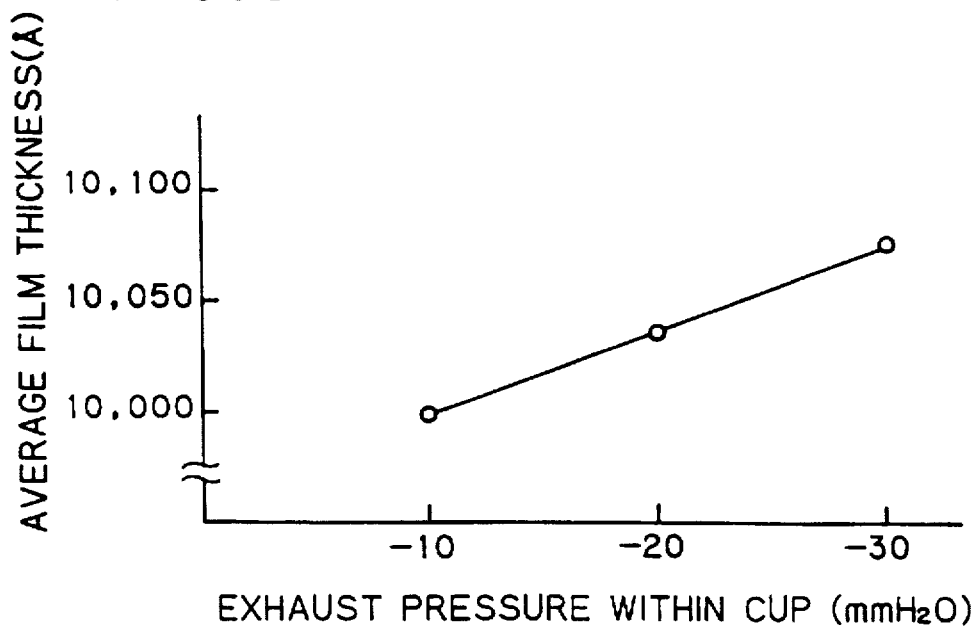
FIG. 9 is a graph showing an example of data which expresses a relationship between the exhaust pressure at which a cup is exhausted and film thickness.
Figure 10:
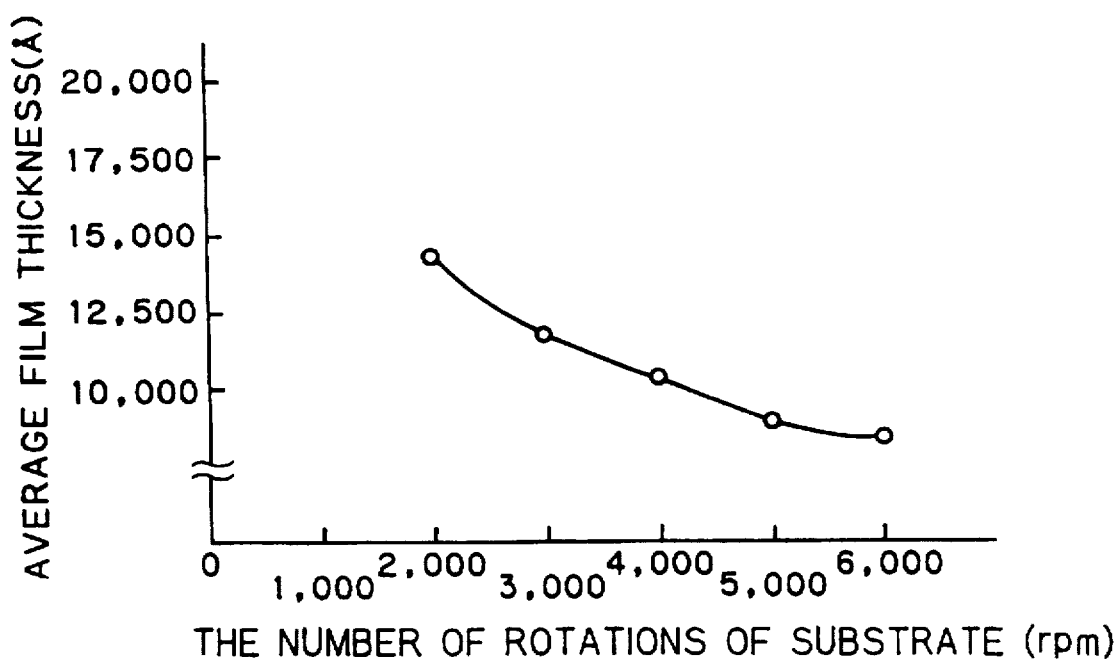
FIG. 10 is a graph showing an example of data which expresses a relationship between the rotational speed of a substrate which is held by a substrate holding member and film thickness.

In addition, although not shown, clean air with an adjusted temperature and an adjusted humidity is supplied from an air-conditioner into an open-air space around the cup 54 so that the clean air flows downward from above around the cup 54. In the open-air space around the cup 54, an atmospheric pressure sensor 72 for measuring the atmospheric pressure (static pressure) is disposed. As in the apparatus shown in FIG. 1, a signal from the atmospheric pressure sensor 72 is supplied to a CPU 76 through an amplifier 74. A key board 78 is connected to the CPU 76. On the key board 78, a reference atmospheric pressure value which is set in advance (or a target film thickness value) is entered in the CPU 76 to be thereafter stored in a memory. A memory 80 connected to the CPU 76 stores not only the data as that shown in FIG. 2, which expresses a relationship between the atmospheric pressure and a film thickness, but also, at least one of the following:

1) data which expresses a relationship between the temperature of the cooling plate 70 (i.e., the temperature of the substrate W before holding the substrate W with the substrate holding member 50) and the film thickness as shown in FIG. 6, for example;
2) data which expresses a relationship between the temperature of a photoresist liquid, which is applied by the coating liquid supplying apparatus onto a surface of the substrate W, and the film thickness as shown in FIG. 7, for example;
3) data which expresses a relationship between the quantity of the photoresist liquid, which is applied onto a surface of each substrate W, which is held by the substrate holding member 50, and the film thickness as shown in FIG. 8, for example;
4) data which expresses a relationship between the exhaust pressure (or displacement), at which the cup 54 is exhausted by exhausting means (not shown) through the pipe 56, and the film thickness as shown in FIG. 9, for example; and
5) data which expresses a relationship between the rotation speed of the substrate W which is rotated by the substrate rotating motor 52 while held by the substrate holding member 50 and the film thickness as shown in FIG. 10, for example. The rotation speed herein referred to is the rotation speed during a process step for adjusting the thickness of the coating liquid after spreading the coating liquid over the entire surface of the substrate.

The CPU 76 is connected to a controller 82. In the rotary-type substrate coating apparatus shown in FIG. 5, the atmospheric pressure (static pressure) of the open-air space above the cup 54 is measured by the atmospheric pressure sensor 72, and a detection signal from the atmospheric pressure sensor 72 is supplied to the CPU 76 through the amplifier 74. Receiving the detection signal from the atmospheric pressure sensor 72, based on the measured atmospheric pressure value and the reference atmospheric pressure value which is set in advance, the CPU 76 calculates a change in the film thickness corresponding to a change in the atmospheric pressure, while utilizing the data shown in FIG. 2. Alternatively, the CPU 76 may calculate a film thickness which corresponds to the measured atmospheric pressure value while utilizing the data shown in FIG. 2, and then calculate a difference between the film thickness and the target film thickness which is determined in advance. Further, utilizing at least one of the respective data shown in FIGS. 6 to 10, the CPU 76 calculates, relative to the film thickness change, the amount of change required in at least one of the following:

the temperature of the cooling plate 70;

the temperature of the photoresist liquid;

the quantity of the photoresist liquid applied per substrate;

the exhaust pressure within the cup 54; and the rotation speed of the substrate W which is held by the substrate holding member 50.

Following this, the CPU 76 calculates how much at least one of the above parameters must be changed to compensate for the change in the film thickness due to the change in the atmospheric pressure. For example, the film thickness becomes thicker (or thinner) by 30 angstroms as the atmospheric pressure decreases (or increases) by 10 hPa. To eliminate such a change in the film thickness, the temperature of the cooling plate 70 may be decreased (or increased) by 1.5° C., the temperature of the photoresist liquid may be decreased (or increased) by 0.8° C., the quantity of the photoresist liquid applied per substrate may be decreased (or increased) by 2 cc, the exhaust pressure within the cup 54 may be decreased (or increased) by 7 mmH$_2$O, or the rotation speed of the substrate may be increased (or decreased) by 20 rpm.

After the CPU 76 calculates a control value, a signal based on the control value is supplied to the controller 82 from the CPU 76. A control signal is supplied from the controller 82 to adjusting parts or driving parts of at least one of the cooling plate 70, the heat exchanger 68 of the coating liquid supplying apparatus, the open/close control valve 66 which is inserted in the supplying tube 64, the exhaust damper 58, and the substrate rotating motor 52, whereby at least one of these parts are controlled. At least one of the parameters, i.e., the temperature of the cooling plate 70, the temperature of the photoresist liquid, the quantity of the photoresist liquid applied per substrate, the exhaust pressure within the cup 54, and the rotation speed of the substrate W held by the substrate holding member 50 are adjusted, and hence, the change in the atmospheric pressure is compensated and a variation in the thickness of the coating film which is formed on a surface of the substrate W is eliminated.

Although the atmospheric pressure sensor 72 is disposed in the space above the cup 54 in the rotary-type substrate coating apparatus shown in FIG. 5, the atmospheric pressure sensor may be disposed at an appropriate position within the clean room. Where a plurality of rotary substrate coating apparatuses are disposed within the same clean room, only one atmospheric pressure sensor and only one control apparatus which is formed by the CPU, the controller and the like may be disposed, and control signals may be supplied from this common control apparatus to the cooling plates and the like of the respective rotary substrate coating apparatuses. In addition, where a plurality of substrate holding members and cups are disposed within one rotary-type substrate coating apparatus, one atmospheric pressure sensor and one control apparatus may be used in common.

In the rotary-type substrate coating apparatus shown in FIG. 5, to compensate for a change in the atmospheric pressure, the rotational speed of the substrate is changed during the process step for adjusting the thickness of the coating liquid after spreading the coating liquid over the entire surface of the substrate. However, instead of this, the rotation speed of the substrate may be changed during a process step for spreading the coating liquid, which is supplied to the surface of the substrate, over the entire surface of the substrate.

Although the atmospheric pressure sensors 36 and 72 are disposed externally to the cups 14 and 54, respectively, in the rotary substrate coating apparatuses shown in FIGS. 1 and 5, since the cups 14 and 54 are each open at the top, the atmospheric pressure remains the same inside and outside the cups 14 and 54. Hence, there is no problem in disposing the atmospheric pressure sensors 36 and 72 externally to the cups 14 and 54. Rather, since the atmospheric pressure sensors 36 and 72 are disposed externally to the cups 14 and 54, there is no possibility that a turbulent flow created by rotation of the substrate W will change a measurement of the atmospheric pressure or mist of a resist splashed from the substrate W will adhere to probes of the atmospheric pressure sensors.

The construction of FIG. 1 may be combined with the construction of FIG. 5 to control at least one of parameters to compensate variation of film thickness due to change of the atmospheric pressure.

When two or more of the control parameters are changed to compensate for the change of the film thickness, ratios or weights for assigning the thickness change to respective control parameters are previously determined and is stored in the memory. That is, the weights Wi for i=1–n are previously determined, where:

i=1: the ambient humidity i=2: the ambient temperature i=3: the temperature of the cooling plate 70;

i=4: the temperature of the photoresist liquid;

i=5: the quantity of the photoresist liquid applied per substrate;

i=6: the exhaust pressure within the cup 54;

i=7: the rotation speed of the substrate W which is held by the substrate holding member 50, and the following sum rule for respective weights is held:

$$W1+W2+W3+W4+W5+W6+W7=1$$

For example, suppose that the weights are previously determined as:

W2=0.3

W3=0.3

W7=0.4

W=W4=W5=W6=0 and the atmospheric pressure is decreased by 10 hPa. In this case, the increase of film thickness by 30 angstroms due to the decrease of the atmospheric pressure can be compensated by the combination of 30×0.3=9 angstroms by decrease of the ambient temperature, 30×0.3=9 angstroms by decrease of the temperature of the cooling plate, and 30×0.4=12 angstroms by increase of the rotation speed.

Various other modifications in the combination are possible within the control parameters, and the calculation for respective changes of the parameters are performed by the CPU 76 according to the weights and the correlations of FIGS. 3, 4, and 6–10.

While the invention has been described in detail, the foregoing description is in all aspects illustrative and not restrictive. It is understood that numerous other modifications and variations can be devised without departing from the scope of the invention.

I claim:

1. A method of applying a liquid onto a substrate to form a film on said substrate while rotating said substrate, comprising the steps of:

a) providing cup means surrounding said substrate and having a top opening above said substrate;

b) sensing atmospheric pressure outside of said cup means;

c) controlling exhaust pressure of air from said cup means in response to said atmospheric pressure;

d) rotating said substrate in horizontal plane; and e) supplying said liquid to said substrate to form said film on said substrate.

2. A method of applying a liquid onto a substrate to form a film on said substrate while rotating said substrate, comprising the steps of:

a) providing cup means surrounding said substrate and having a top opening above said substrate;

b) sensing atmospheric pressure outside of said cup means;

c) controlling temperature and/or humidity of air to said substrate through said top opening of said cup means in response to said atmospheric pressure;

d) rotating said substrate in horizontal plane; and e) supplying said liquid to said substrate to form said film on said substrate.

3. A method of applying a liquid onto a substrate to form a film on said substrate while rotating said substrate, comprising the steps of:

a) providing cup means surrounding said substrate and having a top opening above said substrate;

b) sensing atmospheric pressure outside of said cup means;

c) controlling temperature of said substrate before rotation of said substrate in response to said atmospheric pressure;

d) rotating said substrate in horizontal plane; and e) supplying said liquid to said substrate to form said film on said substrate.

4. A method of applying a liquid onto a substrate to form a film on said substrate while rotating said substrate, comprising the steps of:

a) providing cup means surrounding said substrate and having a top opening above said substrate;

b) sensing atmospheric pressure outside of said cup means;

c) controlling temperature of said liquid in response to said atmospheric pressure;

d) rotating said substrate in horizontal plane; and e) supplying said liquid to said substrate to form said film on said substrate.

5. A method of applying a liquid onto a substrate to form a film on said substrate while rotating said substrate, comprising the steps of:

a) providing cup means surrounding said substrate and having a top opening above said substrate;

b) sensing atmospheric pressure outside of said cup means;

c) controlling quantity of liquid supplied to said substrate in response to said atmospheric pressure;

d) rotating said substrate in horizontal plane; and e) supplying said liquid to said substrate to form said film on said substrate.

6. A method of applying a liquid onto a substrate to form a film on said substrate while rotating said substrate, comprising the steps of:

a) providing cup means surrounding said substrate and having a top opening above said substrate;

b) sensing atmospheric pressure outside of said cup means;

c) controlling rotational speed of said substrate in response to said atmospheric pressure;

d) rotating said substrate in horizontal plane; and e) supplying said liquid to said substrate to form said film on said substrate.

7. A method of applying a liquid onto a substrate to form a film on said substrate while rotating said substrate, comprising the steps of:

a) providing cup means surrounding said substrate and having a top opening above said substrate;

b) sensing atmospheric pressure outside of said cup means;

c) in response to said atmospheric pressure, controlling at least two elements of:

i) temperature and/or humidity of air and supplying said air to said substrate through said top opening of said cup means, ii) temperature of said substrate before rotation of said substrate, iii) temperature of said liquid, iv) quantity of said liquid supplied to said substrate, v) exhaust pressure of said air from said cup means, and vi) a rotational speed of said substrate;

d) rotating said substrate in a horizontal plane; and e) supplying said liquid to said substrate to form said film on said substrate.

8. An apparatus for applying a liquid onto a substrate to form a film on said substrate, comprising:

a) rotation means for rotating said substrate in a horizontal plane;

b) cup means surrounding said substrate and having a top opening above said substrate;

c) supply means for supplying said liquid onto said substrate;

d) sensor means provided outside of said cup means for sensing atmospheric pressure;

e) air supply means for supplying air to said substrate;

f) exhaust means for exhausting said air through an exhaust member of said cup means;

g) exhaust pressure control means for controlling exhaust pressure of said air from said exhaust member;

h) determination means for determining a control value of said exhaust pressure in response to said atmospheric pressure; and i) signal generator means for generating a control signal representing said control value and supplying said control signal to said exhaust pressure control means.

9. The apparatus of claim 8, wherein said determination means includes:

memory means for storing correlation data representing relationship between respective values of said atmospheric pressure and thickness of said film, converter means for converting said atmospheric pressure to a thickness value through said correlation data, and calculator means for calculating a difference between said thickness value and a reference thickness value to determine said control value.

10. The apparatus of claim 9, wherein said calculator means includes:

means for converting a reference atmospheric pressure value to said reference thickness value through said correlation data.

11. The apparatus of claim 10, wherein said calculator means further includes:

input means for inputting said reference atmospheric pressure value.

12. The apparatus of claim 9, wherein said calculator means includes:

means for inputting said reference thickness value.

13. An apparatus for applying a liquid onto a substrate to form a film on said substrate, comprising:

a) rotation means for rotating said substrate in a horizontal plane;

b) cup means surrounding said substrate and having a top opening above said substrate;

c) supply means for supplying said liquid onto said substrate;

d) sensor means provided outside of said cup means for sensing atmospheric pressure;

e) air conditioner means for controlling temperature and/or humidity of air and for supplying air to said substrate through said top of said cup means;

f) determination means for determining a control value of said temperature and/or humidity in response to said atmospheric pressure; and g) signal generator means for generating a control signal representing said control value and supplying said control signal to said air conditioner means.

14. The apparatus of claim 13, wherein said determination means includes:

memory means for storing correlation data representing relationship between respective values of said atmospheric pressure and thickness of said film, converter means for converting said atmospheric pressure to a thickness value through said correlation data, and calculator means for calculating a difference between said thickness value and a reference thickness value to determine said control value.

15. The apparatus of claim 14, wherein said calculator means includes:

means for converting a reference atmospheric pressure value to said reference thickness value through said correlation data.

16. The apparatus of claim 15, wherein said calculator means further includes:

input means for inputting said reference atmospheric pressure value.

17. The apparatus of claim 14, wherein said calculator means includes:

means for inputting said reference thickness value.

18. An apparatus for applying a liquid onto a substrate to form a film on said substrate, comprising:

a) rotation means for rotating said substrate in a horizontal plane;

b) cup means surrounding said substrate and having a top opening above said substrate;

c) supply means for supplying said liquid onto said substrate;

d) sensor means provided outside of said cup means for sensing atmospheric pressure;

e) substrate temperature control means for controlling temperature of said substrate before transfer to said rotation means;

f) determination means for determining a control value of said substrate temperature in response to said atmospheric pressure; and g) signal generator means for generating a control signal representing said control value and supplying said control signal to said substrate temperature control means.

19. The apparatus of claim 18, wherein said determination means includes:

memory means for storing correlation data representing relationship between respective values of said atmospheric pressure and thickness of said film, converter means for converting said atmospheric pressure to a thickness value through said correlation data, and calculator means for calculating a difference between said thickness value and a reference thickness value to determine said control value.

20. The apparatus of claim 19, wherein said calculator means includes:

means for converting a reference atmospheric pressure value to said reference thickness value through said correlation data.

21. The apparatus of claim 20, wherein said calculator means further includes:

input means for inputting said reference atmospheric pressure value.

22. The apparatus of claim 19, wherein said calculator means includes:

means for inputting said reference thickness value.

23. An apparatus for applying a liquid onto a substrate to form a film on said substrate, comprising:

a) rotation means for rotating said substrate in a horizontal plane;

b) cup means surrounding said substrate and having a top opening above said substrate;

c) supply means for supplying said liquid onto said substrate;

d) sensor means provided outside of said cup means for sensing atmospheric pressure;

e) liquid temperature control means for controlling temperature of said liquid;

f) determination means for determining a control value of said liquid temperature in response to said atmospheric pressure; and g) signal generator means for generating a control signal representing said control value and supplying said control signal to said liquid temperature control means.

24. The apparatus of claim 23, wherein said determination means includes:

memory means for storing correlation data representing relationship between respective values of said atmospheric pressure and thickness of said film, converter means for converting said atmospheric pressure to a thickness value through said correlation data, and calculator means for calculating a difference between said thickness value and a reference thickness value to determine said control value.

25. The apparatus of claim 24, wherein said calculator means includes:

means for converting a reference atmospheric pressure value to said reference thickness value through said correlation data.

26. The apparatus of claim 25, wherein said calculator means further includes:

input means for inputting said reference atmospheric pressure value.

27. The apparatus of claim 24, wherein said calculator means includes:

means for inputting said reference thickness value.

28. An apparatus for applying a liquid onto a substrate to form a film on said substrate, comprising:

a) rotation means for rotating said substrate in a horizontal plane;

b) cup means surrounding said substrate and having a top opening above said substrate;

c) supply means for supplying said liquid onto said substrate;

d) sensor means provided outside of said cup means for sensing atmospheric pressure;

e) liquid quantity control means for controlling quantity of said liquid supplied to said substrate;

f) determination means for determining a control value of said quantity of liquid supplied to said substrate in response to said atmospheric pressure; and g) signal generator means for generating a control signal representing said control value and supplying said control signal to said liquid quantity control means.

29. The apparatus of claim 28, wherein said determination means includes:

memory means for storing correlation data representing relationship between respective values of said atmospheric pressure and thickness of said film, converter means for converting said atmospheric pressure to a thickness value through said correlation data, and calculator means for calculating a difference between said thickness value and a reference thickness value to determine said control value.

30. The apparatus of claim 29, wherein said calculator means includes:

means for converting a reference atmospheric pressure value to said reference thickness value through said correlation data.

31. The apparatus of claim 30, wherein said calculator means further includes:

input means for inputting said reference atmospheric pressure value.

32. The apparatus of claim 29, wherein said calculator means includes:

means for inputting said reference thickness value.

33. An apparatus for applying a liquid onto a substrate to form a film on said substrate, comprising:

a) rotation means for rotating said substrate in a horizontal plane;

b) cup means surrounding said substrate and having a top opening above said substrate;

c) supply means for supplying said liquid onto said substrate;

d) sensor means provided outside of said cup means for sensing atmospheric pressure;

e) speed control means for driving said rotation means to control a rotation speed of said substrate;

f) determination means for determining a control value of said rotation speed of said substrate in response to said atmospheric pressure; and g) signal generator means for generating a control signal representing said control value and supplying said control signal to said speed control means.

34. The apparatus of claim 33, wherein said determination means includes:

memory means for storing correlation data representing relationship between respective values of said atmospheric pressure and thickness of said film, converter means for converting said atmospheric pressure to a thickness value through said correlation data, and calculator means for calculating a difference between said thickness value and a reference thickness value to determine said control value.

35. The apparatus of claim 34, wherein said calculator means includes:

means for converting a reference atmospheric pressure value to said reference thickness value through said correlation data.

36. The apparatus of claim 35, wherein said calculator means further includes:

input means for inputting said reference atmospheric pressure value.

37. The apparatus of claim 34, wherein said calculator means includes:

means for inputting said reference thickness value.

38. An apparatus for applying a liquid onto a substrate to form a film on said substrate, comprising:

a) rotation means for rotating said substrate in a horizontal plane;

b) cup means surrounding said substrate and having a top opening above said substrate;

c) supply means for supplying said liquid onto said substrate;

d) sensor means provided outside of said cup means for sensing atmospheric pressure;

e) control means comprising at least two elements of:
   e-1) air conditioner means for controlling temperature and/or humidity of air and for supplying air to said substrate through said top opening of said cup means;
   e-2) substrate temperature control means for controlling temperature of said substrate before transfer to said rotation means;
   e-3) liquid temperature control means for controlling temperature of said liquid;
   e-4) liquid quantity control means for controlling quantity of said liquid supplied to said substrate;
   e-5) exhaust pressure control means for controlling exhaust pressure of said air from said cup means; and
   e-6) speed control means for driving said rotation means to control a rotation speed of said substrate;

f) determination means for determining control values for said at least two elements in response to said atmospheric pressure; and g) signal generation means for generating control signals representing said control values and supplying said control signals to said at least two elements.

39. An apparatus for applying a liquid onto a substrate to form a film on said substrate, comprising:

a) a motor rotating said substrate in a horizontal plane;

b) a cup surrounding said substrate and having a top opening above said substrate;

c) a liquid supply device supplying said liquid onto said substrate;

d) a sensor provided outside of said cup to sense atmospheric pressure;

e) an air supply supplying air to said substrate;

f) an exhaust device exhausting said air through an exhaust member of said cup means;

g) an exhaust pressure controller controlling exhaust pressure of said air from said exhaust member;

h) a determination device determining a control value of said exhaust pressure in response to said atmospheric pressure; and i) a signal generator generating a control signal representing said control value and supplying said control signal to said exhaust pressure control means.

40. An apparatus for applying a liquid onto a substrate to form a film on said substrate, comprising:

a) a motor rotation rotating said substrate in a horizontal plane;

b) a cup surrounding said substrate and having a top opening above said substrate;

c) a liquid supply device supplying said liquid onto said substrate;

d) a sensor provided outside of said cup to sense atmospheric pressure;

e) an air conditioner controlling temperature and/or humidity of air and supplying air to said substrate through said top of said cup;

f) a determination device determining a control value of said temperature and/or humidity in response to said atmospheric pressure; and g) a signal generator generating a control signal representing said control value and supplying said signal to said air conditioner means.

41. An apparatus for applying a liquid onto a substrate to form a film on said substrate, comprising:

a) a motor rotating said substrate in a horizontal plane;

b) a cup surrounding said substrate and having a top opening above said substrate;

c) a liquid supply device supplying said liquid onto said substrate;

d) a sensor provided outside of said cup to sense atmospheric pressure;

e) substrate temperature controller controlling temperature of said substrate before transfer to said motor;

f) a determination device determining a control value of said substrate temperature in response to said atmospheric pressure; and g) a signal generator generating a control signal representing said control value and supplying said control signal to said substrate temperature controller.

42. An apparatus for applying a liquid onto a substrate to form a film on said substrate, comprising:

a) a motor rotating said substrate in a horizontal plane;

b) a cup surrounding said substrate and having a top opening above said substrate;

c) a liquid supply device supplying said liquid onto said substrate;

d) a sensor provided outside of said cup to sense atmospheric pressure;

e) a liquid temperature controller controlling temperature of said liquid;

f) a determination device determining a control value of said liquid temperature in response to said atmospheric pressure; and g) a signal generator generating a control signal representing said control value and supplying said control signal to said liquid temperature controller.

43. An apparatus for applying a liquid onto a substrate to form a film on said substrate comprising:

a) a motor rotating said substrate in a horizontal plane;

b) a cup surrounding said substrate and having a top opening above said substrate;

c) a liquid supply device supplying said liquid onto said substrate;

d) a sensor provided outside of said cup to sense atmospheric pressure;

e) a liquid quantity controller controlling quantity of said liquid supplied to said substrate;

f) a determination device determining a control value of said quantity of liquid supplied to said substrate in response to said atmospheric pressure; and g) a signal generator generating a control signal representing said control value and supplying said control signal to said liquid quantity controller.

44. An apparatus for applying a liquid onto a substrate to form a film on said substrate, comprising:

a) a motor rotating said substrate in a horizontal plane;

b) a cup surrounding said substrate and having a top opening above said substrate;

c) a liquid supply device supplying said liquid onto said substrate;

d) a sensor provided outside of said cup to sense atmospheric pressure;

e) a speed controller driving said motor to control a rotation speed of said substrate;

f) a determination device determining a control value of said rotation speed of said substrate in response to said atmospheric pressure; and g) a signal generator generating a control signal representing said control value and supplying said control signal to said speed controller.

45. An apparatus for applying a liquid onto a substrate to form a film on said substrate, comprising:

a) a motor rotating said substrate in a horizontal plane;

b) a cup surrounding said substrate and having a top opening above said substrate;

c) a liquid supply device supplying said liquid onto said substrate;

d) a sensor provided outside of said cup to sense atmospheric pressure;

e) a control device comprising at least two elements of:
  e-1) an air conditioner controlling temperature and/or humidity of air and supplying air to said substrate through said top opening of said cup;
  e-2) a substrate temperature controller controlling temperature of said substrate before transfer to said motor;
  e-3) a liquid temperature controller controlling temperature of said liquid;
  e-4) a liquid quantity controller controlling quantity of said liquid supplied to said substrate;
  e-5) an exhaust pressure controller controlling exhaust pressure of said air from said cup; and
  e-6) a speed controller driving said motor to control a rotation speed of said substrate;

f) a determination device determining control values for said at least two elements in response to said atmospheric pressure; and g) a signal generator generating control signals representing said control values and supplying said control signals to said at least two elements.

* * * * *